United States Patent
Lin et al.

(10) Patent No.: US 7,371,440 B2
(45) Date of Patent: May 13, 2008

(54) PROTECTIVE FILM FOR LCD AND METHOD FOR MAKING THE SAME

(75) Inventors: Chun-Jen Lin, Tu-Cheng (TW); Zhi-Feng Ma, Shenzhen (CN)

(73) Assignees: Shenzhen Futaihong Precision Industrial Co., Ltd., Shenzhen, Quangdong Province; Sutech Trading Limited, Tortola (VG)

( * ) Notice: Subject to any disclaimer, the term of this patent is extended or adjusted under 35 U.S.C. 154(b) by 220 days.

(21) Appl. No.: 11/204,656

(22) Filed: Aug. 16, 2005

(65) Prior Publication Data

US 2006/0046066 A1     Mar. 2, 2006

(30) Foreign Application Priority Data

Aug. 27, 2004   (TW) ............... 93125720 A

(51) Int. Cl.
  *B32B 27/30*   (2006.01)
  *B32B 27/38*   (2006.01)
  *B32B 32/40*   (2006.01)
(52) U.S. Cl. .................. 428/1.5; 428/1.51; 428/1.53; 428/1.55; 428/1.6; 428/500; 428/913
(58) Field of Classification Search ............... 428/1.5, 428/1.51, 1.6, 1.61, 1.62, 1.53, 1.55, 500, 428/913
See application file for complete search history.

(56) References Cited

U.S. PATENT DOCUMENTS 3,430,560 A * 3/1969 Nettleman ............... 101/407.1
6,500,295 B1 * 12/2002 Kubota ....................... 156/269
2004/0149759 A1 * 8/2004 Moser et al. ............... 220/581

OTHER PUBLICATIONS

English abstract for JP 52064920, 1977.*

* cited by examiner

Primary Examiner—Shean C Wu
(74) Attorney, Agent, or Firm—Morris Manning Martin LLP; Tim Tingkang Xia, Esq.

(57) ABSTRACT

A protective film (1) includes a substrate (10), an upper hardened layer (20), a lower hardened layer (22), a mirror-effect layer (30), and a DLC (Diamond-Like Carbon) film (40). The substrate is made of transparent plastic material, and has an upper surface (100) and a lower surface (102). The upper hardened layer is formed on the upper surface of the substrate, and the lower hardened layer is formed on the lower surface of the substrate. The mirror-effect layer is formed on a surface of the lower hardened layer. The DLC film is formed on a surface of the upper hardened layer. A method for making the protective film is also provided.

18 Claims, 1 Drawing Sheet

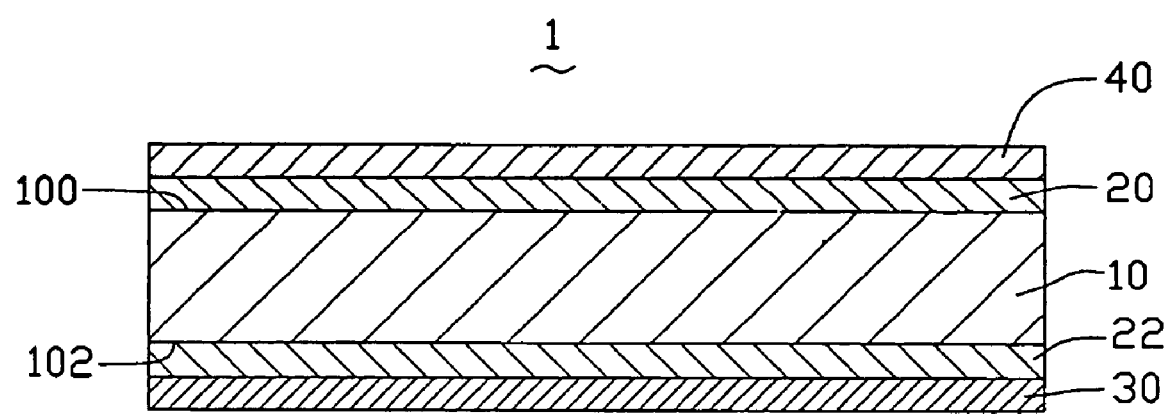

PROTECTIVE FILM FOR LCD AND METHOD FOR MAKING THE SAME

FIELD OF THE INVENTION

The present invention generally relates to protective films for liquid crystal displays (LCDs), and more particularly to a protective film for an LCD of a portable electronic device.

BACKGROUND

Currently, portable electronic devices, such as digital cameras, personal digital assistants (PDAs) and mobile phones, are generally equipped with one or more liquid crystal display (LCD) screens. Most LCD screens of portable electronic devices are made of plastic material. If the LCD screen is not covered or protected, it is susceptible to damage including scratching. Some PDAs and mobile phones have a handwriting input function operated by using a stylus on the LCD screen. These LCD screens are particularly prone to be scratched or damaged. Therefore, a protective film is generally attached onto an LCD screen of a portable electronic device to protect the LCD screen from being scratched or damaged. The material of a conventional protective film is polyethene. However, the polyethene film wears over time, and eventually must be replaced. This adds to the cost of using the portable electronic device.

In addition, the protective film made of polyethene is unduly soft. Therefore, air bubbles tend to form between the LCD screen and the protective film after the protective film is attached onto the LCD screen. The air bubbles degrade the aesthetic appearance of the portable electronic device.

What is needed is a durable protective film for an LCD screen of a portable electronic device.

SUMMARY

A protective film includes a substrate, an upper hardened layer, a lower hardened layer, a mirror-effect layer, and a DLC (Diamond-Like Carbon) film. The substrate is made of transparent plastic material, and has an upper surface and a lower surface. The upper hardened layer is formed on the upper surface of the substrate, and the lower hardened layer is formed on the lower surface of the substrate. The mirror-effect layer is formed on a surface of the lower hardened layer. The DLC film is formed on a surface of the upper hardened layer.

A method for making a protective film comprises the steps of: providing a substrate made of transparent plastic, the substrate having an upper surface and a lower surface; coating a UV-curable (ultraviolet light curable) coating on the upper surface and the lower surface of the substrate; solidifying the UV-curable coating using UV light, thereby forming an upper hardened layer and a lower hardened layer; depositing a metal oxide on the lower hardened layer, thereby forming a mirror-effect layer; and depositing a DLC film on the upper hardened layer, thereby obtaining the protective film.

Other advantages and novel features will become more apparent from the following detailed description when taken in conjunction with the accompanying drawing.

BRIEF DESCRIPTION OF THE DRAWING

The drawing is a schematic, cross-sectional view of a protective film in accordance with a preferred embodiment of the present invention.

DETAILED DESCRIPTION OF PERFERRED EMBODIMENTS

Referring to the drawing, in a preferred embodiment of the present invention, a protective film 1 for a device like LCD screens of portable electronic devices includes a substrate 10, an upper hardened layer 20, a lower hardened layer 22, a mirror-effect layer 30, and a Diamond-Like Carbon (DLC) film 40. The substrate 10 is generally made of transparent plastic material, such as polycarbonate, polymethyl methacrylate, or any combination thereof. The substrate 10 has an upper surface 100 and a lower surface 102. The substrate 10 preferably has a thickness in the range of 0.1-0.25 millimeters. The upper hardened layer 20 is formed on the upper surface 100 of the substrate 10. The lower hardened layer 22 is formed on the lower surface 102 of the substrate 10. Each of the upper hardened layer 22 and the lower hardened layer 22 is made of a UV-curable coating, such as polyurethane acrylate, polyacrylic resin, polyacrylic epoxy, or any combination thereof. The upper hardened layer 20 and the lower hardened layer 22 each preferably have a thickness in the range of 0.5-2.0 microns. The mirror-effect layer 30 is formed on an outer surface of the lower hardened layer 22. The mirror-effect layer 30 preferably has a thickness in the range of 0.1-0.5 microns. The mirror-effect layer 30 is made of metal oxide, such as cobalt oxide, titanium oxide, alumina, or nickel oxide. The DLC film 40 is formed on an outer surface of the upper hardened layer 20, opposite from the mirror-effect layer 30.

In addition, an adhesive film can be formed on an outer surface of the mirror-effect layer 30. The adhesive film is utilized to facilitate attachment of the protective film 1 onto an LCD screen of a portable electronic device.

Referring also to the drawing, in another preferred embodiment of the present invention, a method for making a protective film 1 includes the steps of:

(1) providing a substrate 10 made of transparent plastic material, the substrate 10 having an upper surface 100 and a lower surface 102;

(2) coating a UV-curable coating material on the upper surface 100 and the lower surface 102 of the substrate 10;

(3) hardening the UV-curable coating material by irradiation with UV light to form an upper hardened layer 20 and a lower hardened layer 22;

(4) depositing metal oxide on the lower hardened layer 22 to form a mirror-effect layer 30; and (5) depositing a DLC film 40 on the upper hardened layer 20 to thereby obtain the protective film 1.

In step (1), the transparent plastic material is selected from the group consisting of polycarbonate, polymethyl methacrylate, and any combination thereof. In step (2), the UV-curable coating material is selected from the group consisting of polyurethane acrylate, polyacrylic resin, polyacrylic epoxy, and any combination thereof. In step (4), the metal oxide is selected from the group consisting of cobalt oxide, titanium oxide, alumina, and nickel oxide. In step (5), the DLC film is deposited by means of a sputtering process or a chemical vapor deposition process.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A protective film for an LCD (liquid crystal display), comprising:
   a substrate made of transparent plastic material, the substrate having an upper surface and a lower surface;
   an upper hardened layer formed on the upper surface of the substrate;
   a lower hardened layer formed on the lower surface of the substrate;
   a mirror-effect layer formed on the lower hardened layer; and
   a DLC (Diamond-Like Carbon) film formed on the upper hardened layer.

2. The protective film as claimed in claim 1, wherein the transparent plastic material is selected from the group consisting of polycarbonate, polymethyl methacrylate, and any combination thereof.

3. The protective film as claimed in claim 1, wherein the substrate has a thickness in the range of 0.1-0.25 millimeters.

4. The protective film as claimed in claim 1, wherein the upper hardened layer and the lower hardened layer each have a thickness in the range of 0.5-2.0 microns.

5. The protective film as claimed in claim 1, wherein the mirror-effect layer is made of metal oxide.

6. The protective film as claimed in claim 5, wherein the metal oxide is selected from the group consisting of cobalt oxide, titanium oxide, alumina, and nickel oxide.

7. The protective film as claimed in claim 1, wherein the mirror-effect layer has a thickness in the range of 0.1-0.5 microns.

8. The protective film as claimed in claim 1, further comprising an adhesive film formed on the mirror-effect layer.

9. A method for making a protective film, comprising the steps of:
   providing a substrate made of transparent plastic material, the substrate having an upper surface and a lower surface;
   coating a UV-curable (ultraviolet light curable) coating material on the upper surface and the lower surface of the substrate;
   hardening the UV-curable coating material by irradiation with UV light to form an upper hardened layer and a lower hardened layer;
   depositing metal oxide on the lower hardened layer to form a mirror-effect layer; and
   depositing a DLC (Diamond-Like Carbon) film on the upper hardened layer to obtain the protective film.

10. The method according to claim 9, wherein the DLC film is deposited by means of a sputtering process.

11. The method according to claim 9, wherein the DLC film is deposited by means of a chemical vapor deposition process.

12. A protective film assembly, comprising:
   a substrate made of transparent plastic material;
   a first hardened layer formed on a first surface of the substrate;
   a DLC (Diamond-Like Carbon) film formed on the first hardened layer; and
   a mirror-effect layer formed along a second surface of the substrate different from the first surface of the substrate.

13. The protective film assembly as claimed in claim 12, further comprising a second hardened layer formed between the second surface of the substrate and the mirror-effect layer.

14. The protective film assembly as claimed in claim 12, wherein the mirror-effect layer is made of metal oxide selected from the group consisting of cobalt oxide, titanium oxide, alumina, and nickel oxide.

15. The protective film assembly as claimed in claim 14, wherein the metal oxide layer has a thickness in the range of 0.1-0.5 microns.

16. The protective film assembly as claimed in claim 12, further comprising an adhesive film formed on the mirror-effect layer.

17. The protective film assembly as claimed in claim 13, wherein the first hardened layer and the second hardened layer each has a thickness in the range of 0.5-2.0 microns.

18. The protective film assembly as claimed in claim 12, wherein the substrate has a thickness in the range of 0.1-0.25 millimeters.

* * * * *